(12) United States Patent
Wang et al.

(10) Patent No.: US 7,781,250 B2
(45) Date of Patent: Aug. 24, 2010

(54) WAFER LEVEL CHIP SIZE PACKAGE FOR MEMS DEVICES AND METHOD FOR FABRICATING THE SAME

(75) Inventors: Zhiqi Wang, SuZhou Industrial Park (CN); Guoqing Yu, SuZhou Industrial Park (CN); Qinqin Xu, SuZhou Industrial Park (CN); Wei Wang, SuZhou Industrial Park (CN)

(73) Assignee: China Wafer Level CSP Ltd., Suzhou Industrial Park (CN)

( * ) Notice: Subject to any disclaimer, the term of this patent is extended or adjusted under 35 U.S.C. 154(b) by 227 days.

(21) Appl. No.: 12/132,641

(22) Filed: Jun. 4, 2008

(65) Prior Publication Data

US 2009/0057868 A1    Mar. 5, 2009

(30) Foreign Application Priority Data

Aug. 31, 2007   (CN) ........................ 2007 1 0131491

(51) Int. Cl.
*H01L 21/00*   (2006.01)
(52) U.S. Cl. ........................... 438/68; 438/66; 438/113; 257/E21.499; 257/432; 257/435
(58) Field of Classification Search .......... 257/E21.499, 257/E23.021, E23.181, E31.11, 432, 433, 257/435, 690, 737; 438/66, 68, 113, 118
See application file for complete search history.

(56) References Cited

U.S. PATENT DOCUMENTS

| 6,288,851 | B1 * | 9/2001 | Tomita ....................... 359/809 |
| 6,777,767 | B2 * | 8/2004 | Badehi ....................... 257/432 |
| 7,154,156 | B2 * | 12/2006 | Minamio et al. ............ 257/431 |
| 7,180,149 | B2 * | 2/2007 | Yamamoto et al. .......... 257/434 |
| 7,187,051 | B2 * | 3/2007 | Wataya ....................... 257/433 |
| 7,271,024 | B2 * | 9/2007 | Huang et al. ................. 438/51 |
| 7,332,783 | B2 * | 2/2008 | Misawa, Takeshi ......... 257/432 |
| 2002/0027296 | A1 * | 3/2002 | Badehi ....................... 257/783 |
| 2009/0263927 | A1 * | 10/2009 | Lin et al. ...................... 438/66 |

* cited by examiner

*Primary Examiner*—Chris Chu
(74) *Attorney, Agent, or Firm*—Allen, Dyer, Doppelt, Milbrath & Gilchrist, P.A.

(57) ABSTRACT

The present invention provides a wafer level chip size package having cavities within which micro-machined parts are free to move, allowing access to electrical contacts, and optimized for device performance. Also a method for fabricating a wafer level chip size package for MEMS devices is disclosed. This packaging method provides a well packed device with the size much closely to the original one, making it possible to package the whole wafer at the same time and therefore, saves the cost and cycle time.

10 Claims, 6 Drawing Sheets

WAFER LEVEL CHIP SIZE PACKAGE FOR MEMS DEVICES AND METHOD FOR FABRICATING THE SAME

CROSS-REFERENCE TO RELATED APPLICATIONS

The present invention claims priority from Chinese Patent Application Ser. No. 200710131491.3 filed Aug. 31, 2007, entitled "Wafer Level Chip Size Package For MEMS Devices And Method For Fabricating The Same" by Wang et al., which is incorporated herein by reference for all purposes.

FIELD OF THE INVENTION

The present invention relates generally to wafer level chip size package, and more particularly to wafer level chip size package for micro-electromechanical system (MEMS) devices and methods for fabricating the same.

BACKGROUND OF THE INVENTION

With the miniaturization of electronic devices and increase of circuit density in semiconductor industry, technology of chip size package (CSP) is now under great development, of which the package size is similar to the semiconductor chip encased therein. The ratio of a typical CSP to the edge dimension is no larger than 120% as defined by Joint Electron Device Engineering Council (JEDEC). Compared with the conventional packaging technology, such as wire bonding, tape automatic bonding (TAB) and flip chip, CSP has following advantages: ultra-small package reaching the original size, full protection on the bare die, good electrical and heat performances, convenient for tests, easy to be welded, assembled and replaced. CSP is manufactured either in the form of individual chips diced from a wafer, or in a wafer form and then individual chip size packages are singulated from the wafer. The latter is referred to as a wafer level chip size package (WLCSP).

For WLCSP, generally a plurality of compatible pads formed in a peripheral arrayed type on semiconductor chips are redistributed through conventional redistribution processes involving a redistribution layer into a plurality of metal pads, sometimes called solder bumps, in an area array type. Since packaging and testing are performed at wafer level and then the wafer is diced, WLCSP has significant advantages as follows: Firstly, the process is optimized to perform packaging directly at wafer level, whereas, for prior art methods, the wafer has to be diced and classified before being packaged; secondly, packaging, marking and testing are all performed at wafer level; therefore the production cycle and cost are significantly reduced.

Shellcase Co. Israel developed its unique and advanced WLCSP technologies as ShellOP, ShellOC, and ShellUT to package image sensors, as disclosed in U.S. Pat. Nos. 6,646, 289, 6,777,767 and 6,972,480. Unlike many packaging methods, the Shellcase process requires no lead frames or wire bonding. Briefly, ShellOP utilizes a glass/silicon/glass sandwiched structure to enable image-sensing capabilities through the actual packaging structure so as to protect the sensors from being contaminated by external environment. ShellOC adopts the same sandwich structure, but extra cavities are configured on a first glass by spinning photo-imageable epoxy on the glass to form a pattern with lithography technique, for accommodating the above imagers. Also, cavities enable the use of micro-lenses for enhancing image quality. ShellOC is thus a packaging solution to choice of image sensors with micro-lenses. In the ShellUT package, cavities are still kept but a second glass is removed so that the related package height is reduced.

FIG. 1 is a typical cross-section view of a packaged chip device by prior art ShellOC, wherein a first/top glass with cavity walls thereon covers compatible pads furnished silicon chip. An epoxy is used to bond a second/bottom glass to the chip on which a portion of compatible pads have been exposed before using photolithography and plasma etching techniques. After a barrier solder mask is coated on the second glass, notching is performed so that inverted leads, via sputtering deposition, connect electrically to the compatible pads in form of a so-called T-shape junction. The leads are coated with a protective solder mask thereon. The solder mask is a dielectric material that electrically isolates the leads from external contacts, and protects the lead surface against corrosion. Solder bumps are attached to the bottom end of leads, and are suitable for printed circuit board (PCB) mounting by known methods. Solder bumps may be formed by known methods like screen printing. FIG. 2 is a typical cross-section view of a packaged chip device by prior art ShellOP. FIG. 3 is a typical cross-section of a packaged chip device by prior art ShellUT.

MEMS is a kind of tiny mechanical device that is built onto semiconductor chips and is measured in micrometers. It makes use of silicon micromachining technology, LIGA (Lithographie Galvanoformung Abformung) and precision mechanical engineering technology to fabricate microscopic mechanisms on the surface of a semiconductor wafer. MEMS has a wide range of applications, such as accelerometers, pressure sensors, actuators and many others. In any case above, MEMS devices are usually adapted to employ spatially active elements (gears, hinges, slides, etc) which must be typically free to move and therefore require a cavity surrounding.

Good packaging techniques are relatively more important for the successful performance of the components. The conventional packaging techniques for MEMS devices are ceramic package and metal package, both of them can provide a strong and hermetic enough component. However, both of them are ordinarily very expensive, for many conventionally produced MEMS components, the processes of packaging may take up about 70-85% from the total fabrication cost. Moreover, the packages in most cases are not small enough for handhold applications like cell phones. It is well-known that price and size are the two factors which are most sensitive in customer electronics that ought to be the biggest market of MEMS devices.

Although the Shellcase technique is quite suitable for optical and image sensors, e.g., charge-coupled devices (CCD) and/or CMOS imagers integrated on a silicon wafer, it is actually not fully satisfiable for MEMS devices.

First, in most cases, MEMS package has to provide inert gas filling in or high vacuum so as to protect the fragile movable parts, which requires high hermetic packaging, but the epoxy made cavity wall by conventional Shellcase technique is impossible to handle this. Secondly, many MEMS devices make use of inner gas as a medium. For example, a kind of MEMS accelerometer places sensors at certain position to detect the heat distribution of the inner gas so that it can monitor the movement of the gas and accordingly convert to the value of acceleration. In this case, the more gas filled in, the more sensitive this device would be. In order to get a better performance, it is necessary to make cavities on the cap substrate. But these cavities will make it difficult to form cavity wall, it is easy to understand that spin coating can only be performed on flat surface unless the uniformity of coating is out of concern. Thirdly, because of its complex structure, substrate wafer can not be thinned as much as in general IC wafer, with a typical thickness of about 400-500 um rather than 100 um. Under this circumstance, traditional RIE process can hardly ensure well enough groove shape and well enough uniformity.

Therefore, there is a need of wafer level chip size package for MEMS devices which would reduce both of the packaged size and cost. This package technique must provide a well controlled cavity within which micro-machined parts are free to move, allowing access to electrical contacts, and optimized for device performance.

SUMMARY OF THE INVENTION

The present invention intends to solve the problems existing in prior art WLCSP, and to provide an improved wafer level chip size package satisfied for MEMS devices and methods for fabricating the same.

According to the present invention, a wafer level chip size package for MEMS devices is provided, comprising:

a substrate wafer having formed thereon MEMS dies, with a plurality of compatible pads disposed at the periphery of each of the MEMS dies on the substrate wafer;

a cap substrate with cavities, the cap substrate includes cavity walls by which the cap substrate is combined with the substrate wafer, each of the MEMS dies being encased within a corresponding cavity;

a first insulating layer over a non-active surface of the substrate wafer, while leaving portions of the compatible pads exposed;

a layer of redistribution leads over portions of the first insulating layer and the exposed compatible pads;

a second insulating layer on the redistribution leads, while leaving portions of the redistribution leads exposed;

a plurality of solder bumps formed on exposed portions of the redistribution leads, each solder bump corresponding to a compatible pad.

Wherein, the position of each of the cavities is defined by the cavity walls.

Wherein, the depth of the cavities is no less than 350 um.

Wherein, the cavities are filled with inert gas.

Wherein, the thickness of the cavity walls is within the range of 10-40 um.

Wherein, the cavity walls are made of BCB (DOW chemical) or glass frit.

Wherein, the cap substrate is made of silicon or glass.

Wherein, the redistribution leads are made of Al/Ni alloys.

Wherein, the second insulating layer is made of photo sensitive thermoplastic polymer.

Wherein, the solder bumps are made of lead-free solder paste.

According to the present invention, a method for fabricating a wafer level chip size package for MEMS devices is also provided, comprising following steps:

providing a substrate wafer having formed thereon MEMS dies, with a plurality of compatible pads disposed at the periphery of each of said MEMS dies on the substrate wafer;

providing a cap substrate, spin coating photo sensitive BCB on said cap substrate, then form a plurality of cavity walls by lithography, the position of each cavity wall is corresponding to that of the MEMS die;

aligning and bonding the substrate wafer with the cap substrate;

thinning the substrate wafer by backside grinding, notching to remove most of the substrate wafer material at scribe lines;

plasma etching at the backside of the substrate wafer to remove the rest of the substrate wafer material and expose part of the compatible pads, trenches being formed;

filling the trenches with insulating materials to cover the exposed compatible pads, spin coating this insulating material on the backside of the substrate wafer as a first insulating layer;

notching again to expose flanks of the compatible pads;

depositing a metal layer on the backside of the substrate wafer by sputtering, forming redistribution leads by lithography and plating;

spin coating a photo sensitive second insulating layer to cover the redistribution leads, making openings by lithography for solder bump forming;

forming solder bumps at the openings of the second insulating layer by screen printing, each solder bump corresponding to a compatible pad;

dicing the substrate wafer along the scribe lines to singulate the MEMS dies therefrom.

Wherein, the method further comprises following steps prior to the step of aligning and bonding the substrate wafer with the cap substrate:

forming cavities on the cap substrate by wet etching or plasma etching, utilizing the cavity walls as a mask so that the position of each cavity corresponds to that of the MEMS die.

Alternatively, a method for fabricating a wafer level chip size package for MEMS devices, comprising following steps:

providing a substrate wafer having formed thereon MEMS dies, with a plurality of compatible pads disposed at the periphery of each of said MEMS dies on said wafer;

providing a cap substrate;

screen printing glass frit on the cap substrate to form cavity walls;

aligning and bonding the substrate wafer with the cap substrate;

thinning the substrate wafer by backside grinding, notching to remove most of the substrate wafer material at scribe lines;

plasma etching at the backside of the substrate wafer to remove the rest of the substrate wafer material and expose part of the compatible pads, trenches being formed;

filling the trenches with insulating materials to cover the exposed compatible pads, spin coating this insulating material on the backside of the substrate wafer as a first insulating layer;

notching again to expose flanks of the compatible pads;

depositing a metal layer on the backside of the substrate wafer by sputtering, forming redistribution leads by lithography and UBM technique;

spin coating a photo sensitive second insulating layer to cover the redistribution leads, making openings by lithography for solder bump forming;

forming solder bumps at the openings of the second insulating layer by screen printing, each solder bump corresponding to a compatible pad;

dicing the substrate wafer along the scribe lines to singulate the MEMS dies therefrom.

Wherein, the method further comprises following steps prior to the step of screen printing glass frit on the cap substrate to form cavity walls:

depositing a passivation layer on frontside of the cap substrate by PECVD, spin coating photo resist on the passivation layer, making pattern by lithography, the area which need not to be etched should be covered by photo resist;

plasma etching at frontside of the cap substrate, after etching, stripping the photo resist, the pattern of the passivation layer being the same as that of the photo resist;

making cavities on the cap substrate by wet etching or dry etching, utilizing the passivation layer as a mask so that the position of each cavity corresponds to that of the MEMS die.

BRIEF DESCRIPTION OF THE DRAWINGS

Hereinafter, the present invention will be further described in details in combination with the accompanying drawings and the preferred embodiments.

Figure 1:
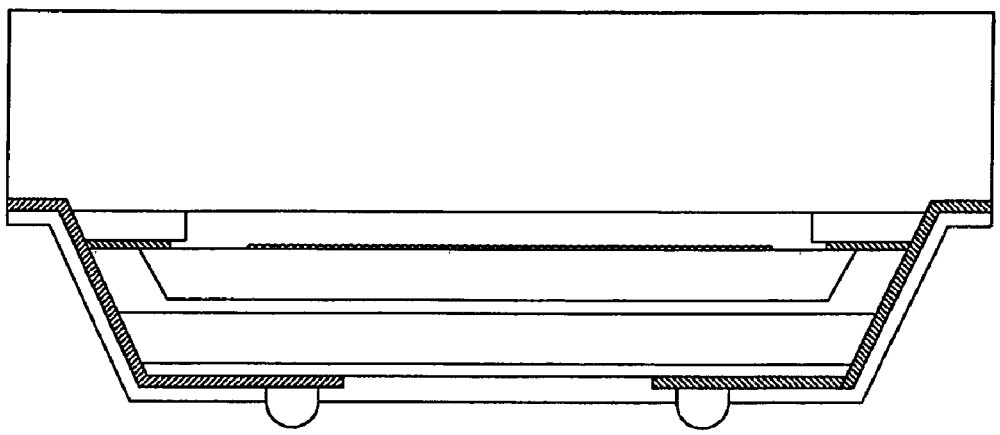
FIG. 1 illustrates a schematic cross-sectional view of a packaged chip device by prior art ShellOC.
Figure 2:
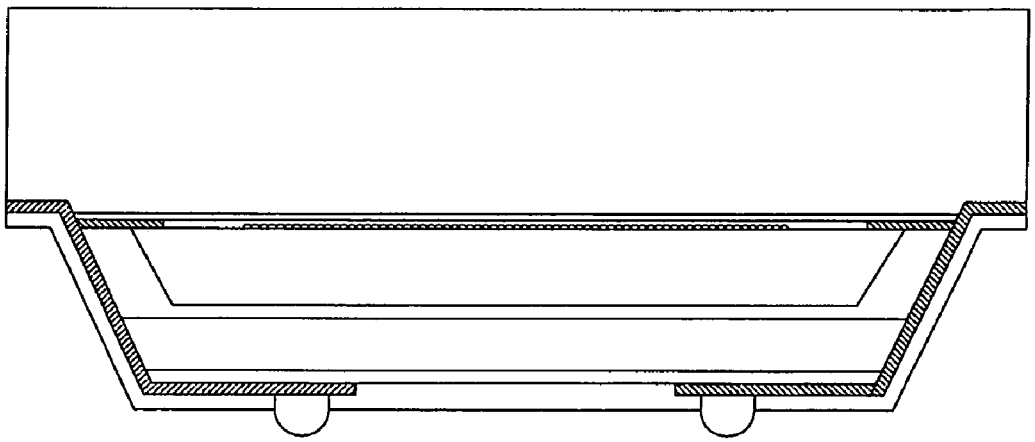
FIG. 2 illustrates a schematic cross-sectional view of a packaged chip device by prior art ShellOP.
Figure 3:
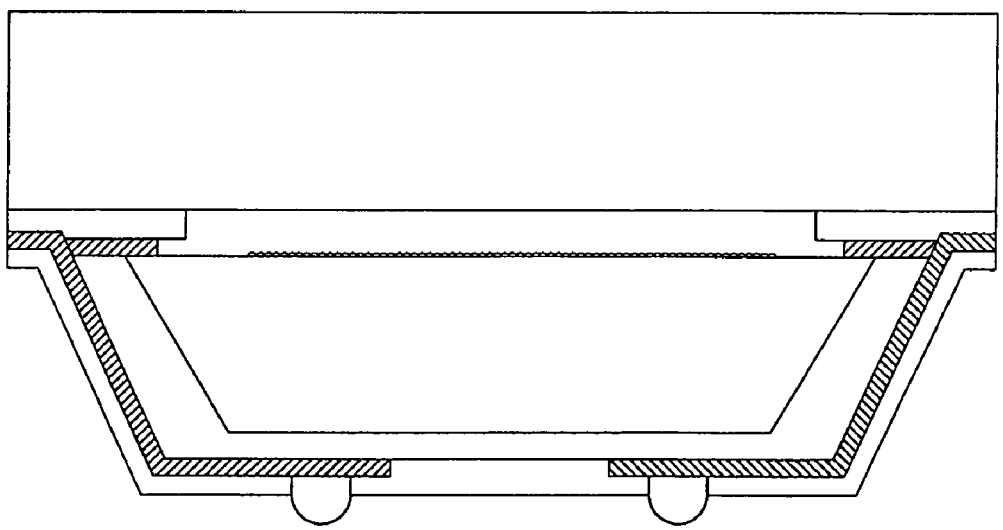
FIG. 3 illustrates a schematic cross-sectional view of a packaged chip device by prior art ShellUT.

In the figures, the reference numeral 5 denotes a cap substrate, the numeral 10 denotes a cavity wall, the numeral 15 denotes a compatible pad, the numeral 20 denotes a substrate wafer, the numeral 25 denotes a cushion layer, the numeral 30 denotes a redistribution lead, the numeral 35 denotes a solder mask, the numeral 40 denotes a solder bump, the numeral 45 denotes a passivation layer, the numeral 50 denotes a photo resist.

DETAILED DESCRIPTION OF EXEMPLARY EMBODIMENTS

Figure 14:
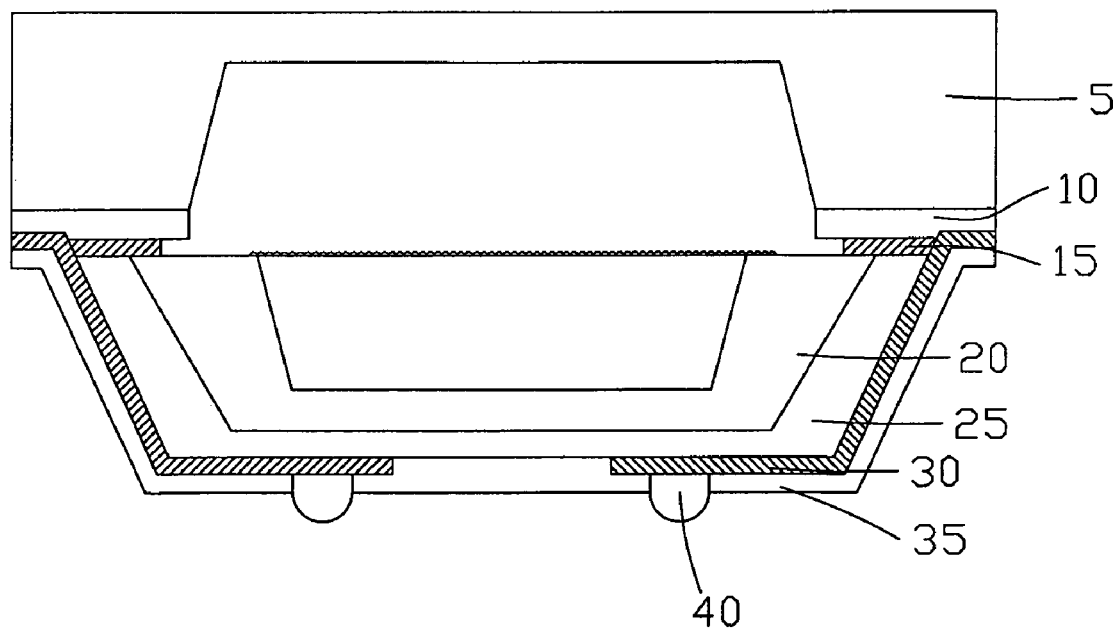

As shown in FIG. 14, according to embodiment 1 of the present invention, a wafer level chip size package for MEMS devices includes a substrate wafer 20, a cap substrate 5, a cushion layer 25, a layer of redistribution leads 30, solder mask 35 and a plurality of solder bumps 40.

The substrate wafer 20 has formed thereon MEMS dies formed with certain MEMS structures, such as gears, hinges, slides, etc. There are also electrical terminals, preferably in the form of so called compatible pads 15 disposed at the periphery of each of the MEMS dies on the substrate wafer 20.

The cap substrate 5 has cavities which can be filled in inert gas with a certain pressure. The cap substrate 5 includes cavity walls 10 by which the cap substrate 5 is combined with the substrate wafer 20, each of the MEMS dies being encased within a corresponding cavity. Preferably though not necessarily, the depth of cavities is within the approximate range of 300-400 um, the thickness of cavity walls 10 is within the approximate range of 10-40 um.

The cushion layer 25 is disposed over a non-active surface of the substrate wafer 20, while leaving portions of the compatible pads 15 exposed.

The layer of redistribution leads is disposed over portions of the cushion layer 25 and the exposed compatible pads 15.

The solder mask 35 is disposed on the redistribution leads, while leaving portions of the redistribution leads exposed. Preferably though not necessarily, the solder mask 35 is formed of photo sensitive thermoplastic polymer such as BCB, polyimide and epoxy etc.

The solder bumps 40 are formed on exposed portions of the redistribution leads, each solder bump 40 corresponding to a compatible pad 15. Preferably though not necessarily, the solder bumps 40 are formed of lead-free solder paste.

There are two optional methods to form cavity walls 10. One is to spin coat photosensitive BCB on flat cap substrate so as to form cavity walls by lithography. BCB is capable to endure KOH, so in this case, BCB is utilized as a mask for wet etching when forming the cavity. The other one is to etch the cap substrate to form cavities first, then screen print glass frit on etched cap substrate to form cavity walls.

According to embodiment 1 of the present invention, an exemplary process flow of forming the wafer level chip size package for MEMS devices is illustrated from FIG. 4 to FIG. 14.

Figure 4:
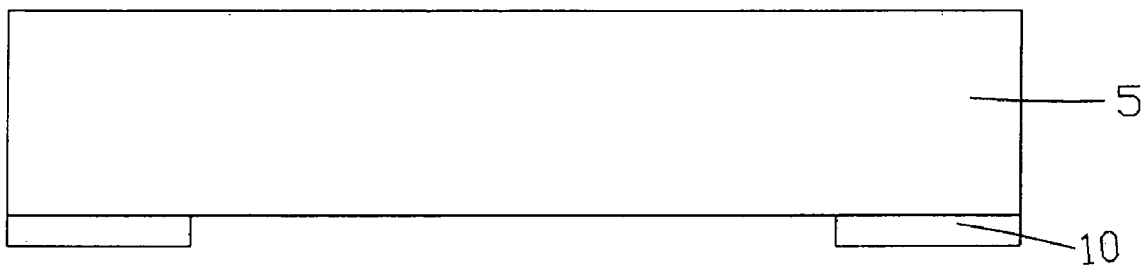
FIG. 4~FIG. 14 illustrate a schematic process flow according to embodiment 1 of the present invention.

As illustrated in FIG. 4, spin coat BCB on a cap substrate 5 at first, then form cavity walls 10 by lithography, the position of each cavity wall 10 is corresponding to that of the substrate wafer 20. The cap substrate 5 is formed of materials with a proper value of CTE and should be easy to be etched, such as silicon or glass.

Figure 5:
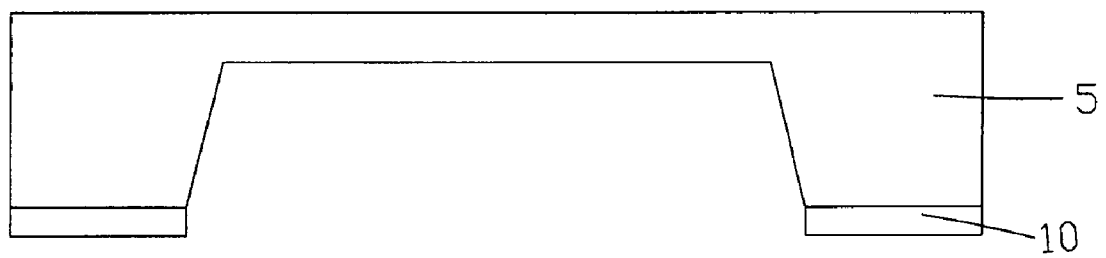

As illustrated in FIG. 5, form cavities on the cap substrate 5 by wet etching or plasma etching; utilize the cavity walls 10 as a mask so that the position of each cavity corresponds to that of the substrate wafer 20. Particularly, if gas filling is not required, this step can be skipped.

Figure 6:
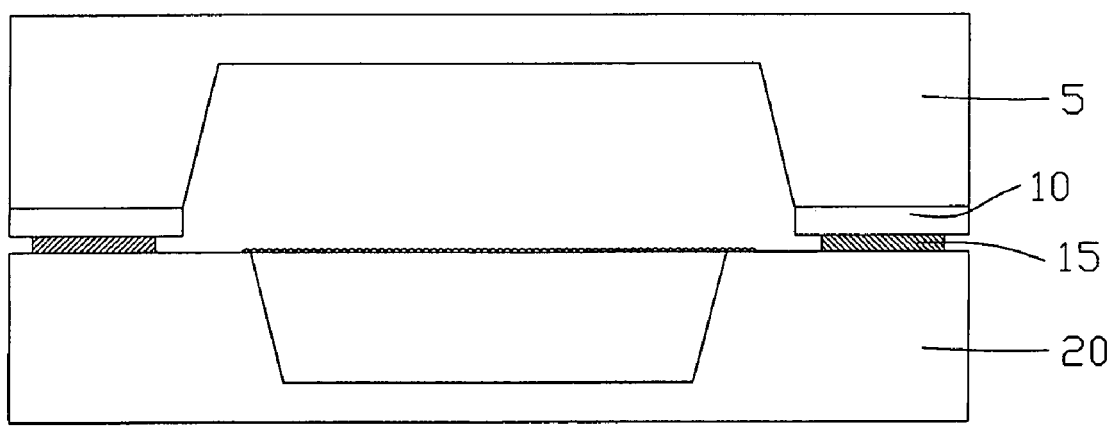

As illustrated in FIG. 6, align the substrate wafer 20 with the cap substrate 5 and apply pressure to achieve bonding. Each cavity wall 10 will be pressed onto the compatible pads 15 and the MEMS structure is inside of the cavity. During bonding, air can be pumped out to get high vacuum and inertia gas can be filled in for certain applications.

Figure 7:
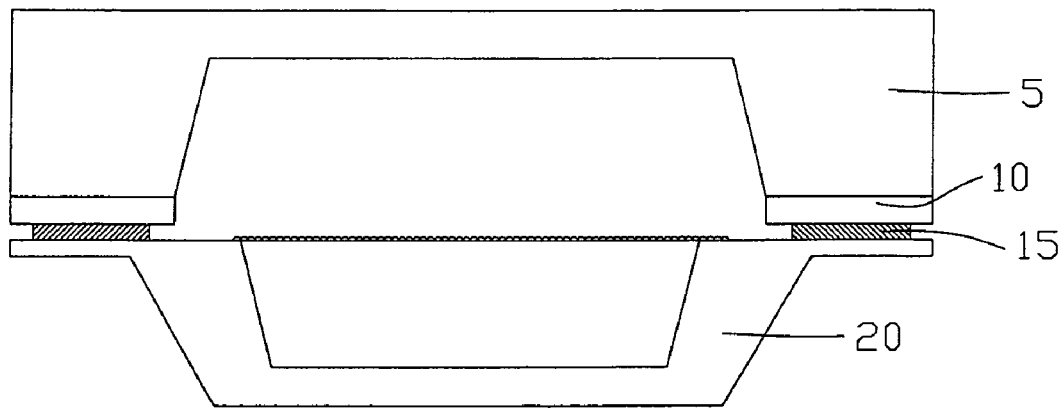

As illustrated in FIG. 7, thin the substrate wafer 20 by backside grinding, notch it by special blade with certain angle to remove most of the silicon at the scribe lines. Preferably though not necessarily, the thickness of remaining silicon is around 10 um.

Figure 8:
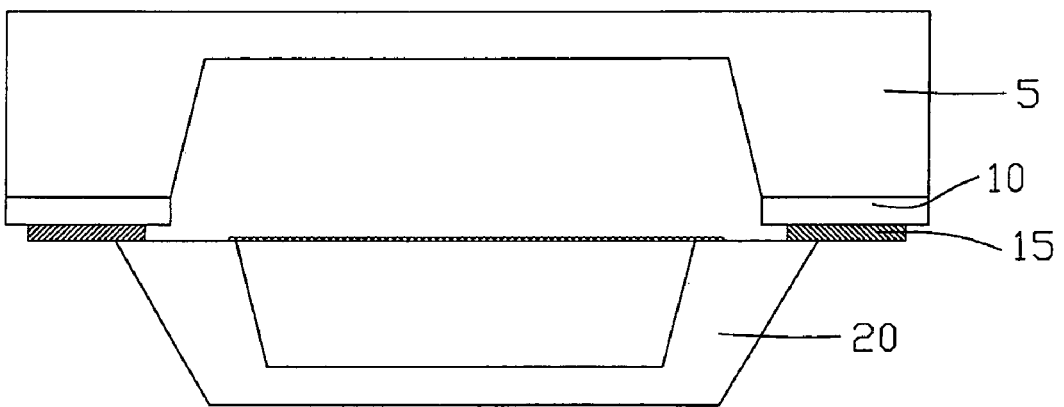

As illustrated in FIG. 8, plasma etch at the backside of the substrate wafer 20 to remove the rest silicon and expose part of the compatible pads 15.

Figure 9:
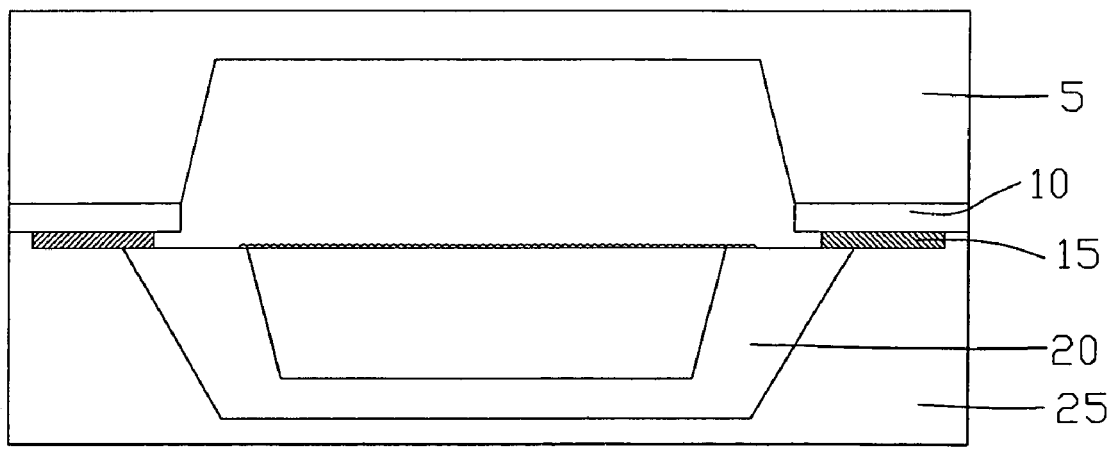
Figure 10:
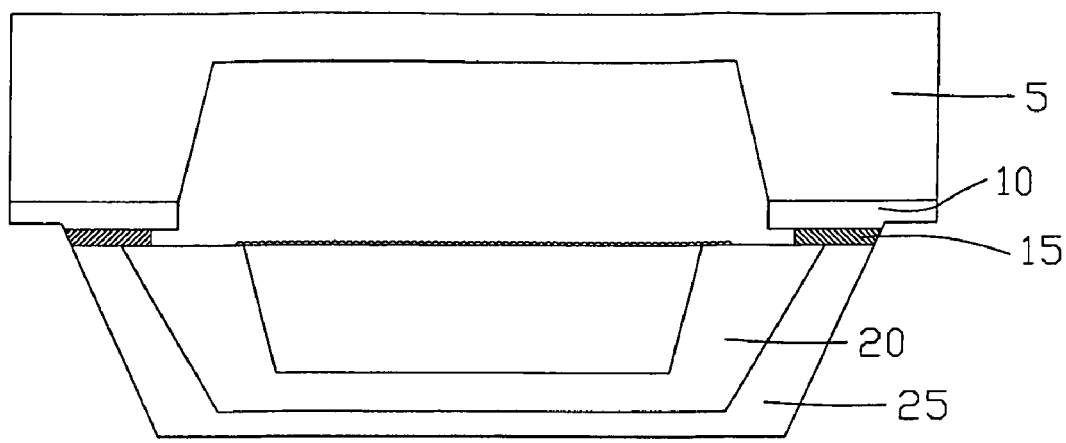

As illustrated in FIG. 9, fill the trench with insulating materials to cover the silicon and the exposed compatible pads 15. Spin coat this insulating material on the backside of the substrate wafer as a cushion layer 25.

As illustrated in FIG. 10, notch again to expose the flank of the compatible pads 15. Particularly, if the cap substrate 5 is made of electric material such as silicon, the blade cannot cut into the cavity wall 10 otherwise the substrate wafer will be connected electrically to the cap substrate 5.

Figure 11:
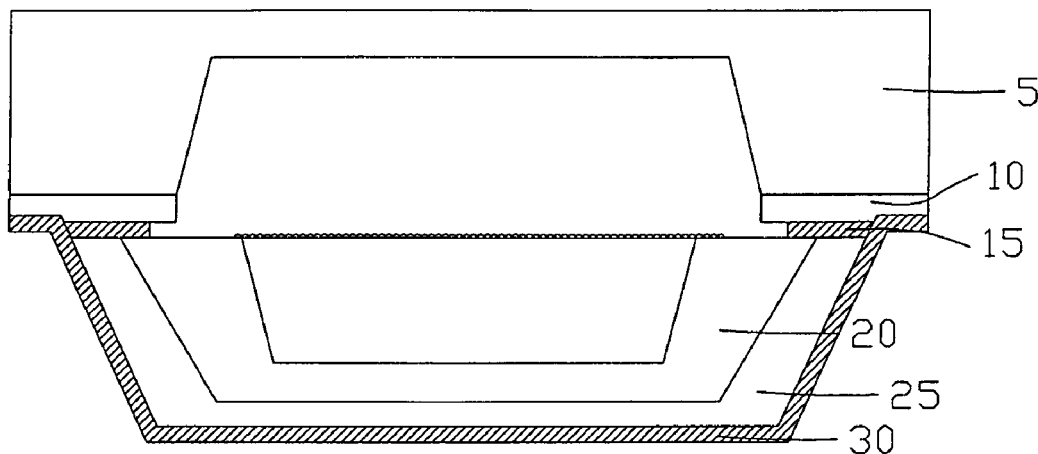

As illustrated in FIG. 11, deposit a metal layer on the backside of the substrate wafer 20 by sputtering. Preferably though not necessarily, this metal layer is Al.

Figure 12:
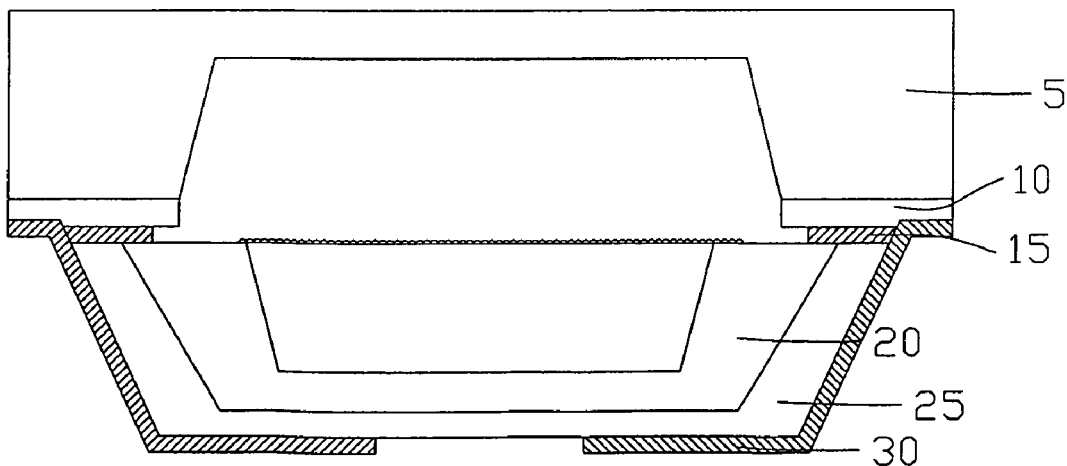

As illustrated in FIG. 12, form redistribution leads 30 by lithography and well known UBM (under bump metallization) technique.

Figure 13:
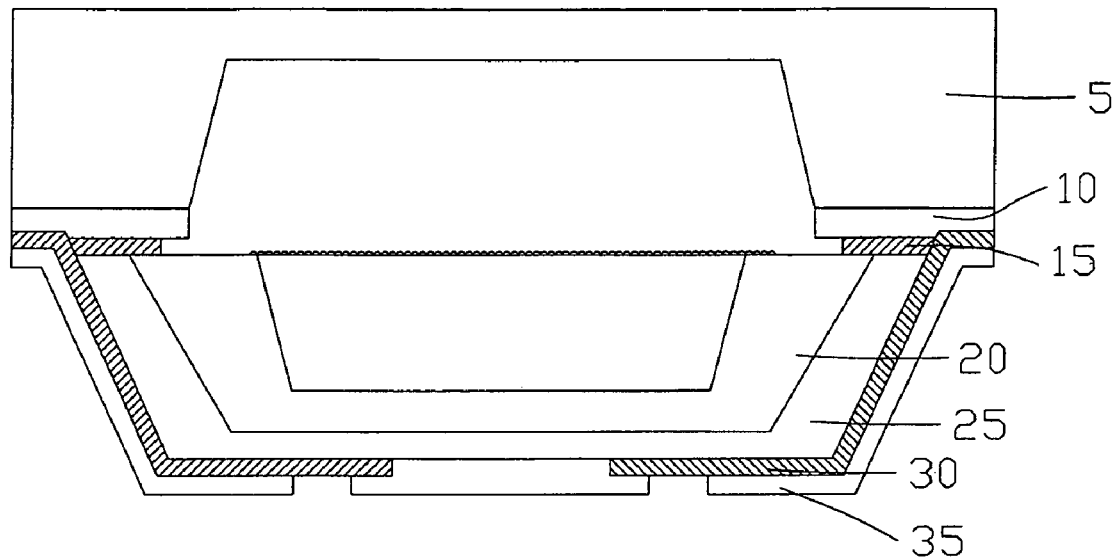

As illustrated in FIG. 13, spin coat a photo sensitive solder mask 35 to cover the redistribution leads 30, make openings by lithography for solder bump planting.

As illustrated in FIG. 14, plant solder bumps 40 at the openings of the solder mask 35 by screen printing, each solder bump 40 corresponding to a compatible pad 15.

As an end of the process, after all the above steps, dice the substrate wafer 20 along the scribe lines to singulate the MEMS dies therefrom.

Preferably though not necessarily, this process flow may also include the following steps: before cavity formation, make one pair of alignment marks at the backside of the cap substrate 5 by lithography, the alignment of cavity formation (expose) and bonding will be according with these marks; before the first notch, spin coat photo resist on the non-active surface of the substrate wafer 20 and make photo resist openings at the positions corresponding to those of the compatible pads 15 by backside align system or IR align system. The first notch will then be aligned according to these openings and the photo resist will be utilized as a mask for etching which is the following step of the first notch. Preferably though not necessarily, the type of photo resist for these two steps is positive, the gases for etching are fluorocarbon or sulfur-fluoride.

According to embodiment 2 of the present invention, instead of the steps illustrated in FIG. 4 and FIG. 5, an alternative method of forming the cavity walls 10 is illustrated from FIG. 15 to FIG. 18.

Figure 15:
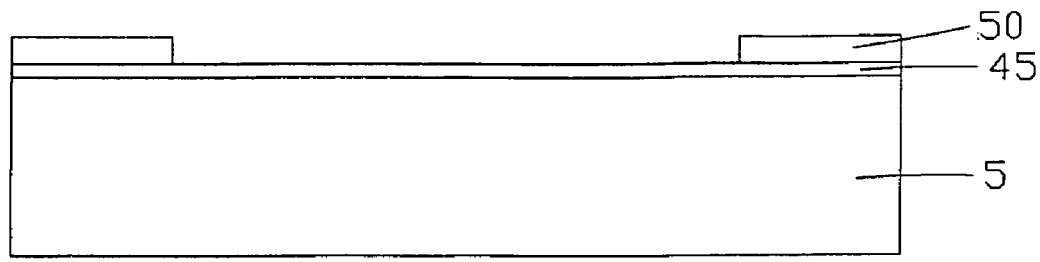
FIG. 15~FIG. 18 illustrate a preceding stage of the whole schematic process flow according to embodiment 2 of the present invention.

As illustrated in FIG. 15, deposit a passivation layer 45 on the front side of the cap substrate 5 by PECVD (plasma enhanced chemical vapor deposition), spin coat photo resist 50 on the passivation layer 45, make pattern by lithography, the area which need not to be etched should be covered by photo resist 50.

Figure 16:
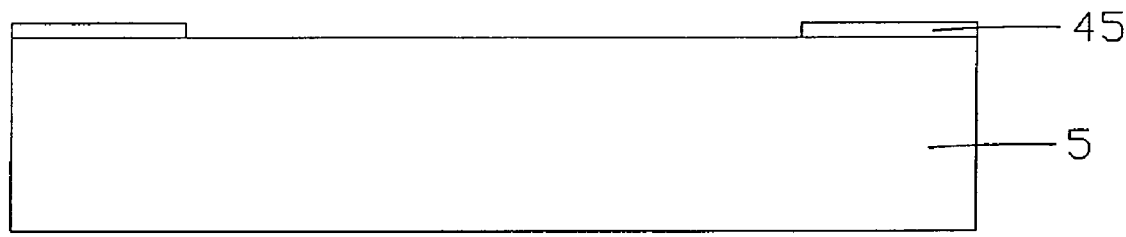

As illustrated in FIG. 16, plasma etch at the front side of the cap substrate, the photo resist 50 will protect the passivation layer 45 from being etched while the exposed passivation layer 45 will be etched. After etching, strip the photo resist 50, the pattern of the passivation layer 45 is the same as that of the photo resist 50.

Figure 17:
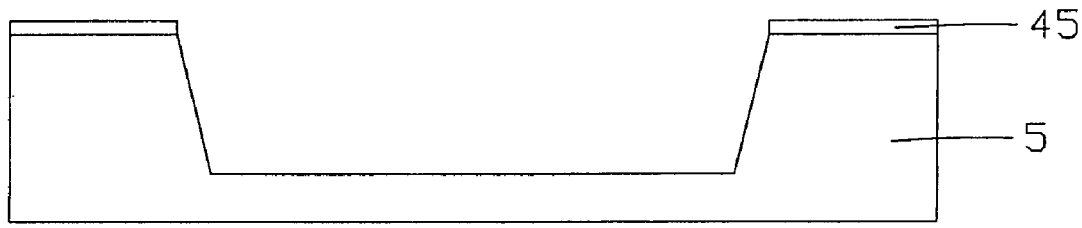

As illustrated in FIG. 17, make cavities on the cap substrate 5 by wet etching or dry etching, utilize the passivation layer 45 as a mask so that the position of each cavity corresponds to that of the MEMS die.

Figure 18:

As illustrated in FIG. 18, screen print glass frit on the cap substrate 5 as cavity walls 10.

The subsequent steps are the same as those in embodiment 1 which are illustrated from FIG. 6 to FIG. 14.

Particularly, if gas filling is not required, the steps described from FIG. 15 to FIG. 17 can be skipped. Preferably though not necessarily, this process flow may also include the following steps: before cavity formation, make one pair of alignment marks at the backside of the cap substrate 5 by lithography, the alignment of cavity formation (expose) and bonding will be according to these marks; with reference to the marks at the backside, making another pair of alignment marks at frontside of the cap substrate 5 by lithography, so that the screen print will be aligned according to these marks; before the first notch, spin coat photo resist on the backside of the substrate wafer 20 and make photo resist openings at the positions corresponding to those of the compatible pads 15 by backside align system or IR align system. The first notch will then be aligned according to these openings and the photo resist will be utilized as a mask for etching which is the following step of the first notch. Preferably though not necessarily, the type of photo resist for these two steps is positive, the gases for etching are fluorocarbon or sulfur-fluoride.

In summary, an improved wafer level chip size package for MEMS devices and method for fabricating the same has been provided. The first process utilize photo sensitive BCB to form cavity walls which will protect the cap substrate 5 from being etched when forming cavities and the BCB bonding results in a hermetic enclosure. Alternatively, screen print glass frit on etched substrate and utilize it as cavity walls. The glass frit bonding also realizes a hermetic enclosure. The innovative solution of removing most of the silicon by the first notch before plasma etching effectively solves the difficulty of etching which is induced by the thick silicon. This packaging method provides a well packed device with the size much closely to the original one, making it possible to package the whole wafer at the same time and therefore, saves the cost and cycle time.

Although this invention has been described in connection with specific forms and embodiments thereof, it will be appreciated that various modification may be made from the specific details described here in without departing form the spirit or scope of the invention as set forth in the appended claims.

What is claimed is:

1. A method for fabricating a wafer level chip size package for MEMS devices comprising:
   providing a substrate wafer having formed thereon MEMS dies, with a plurality of compatible pads disposed at the periphery of each of said MEMS dies on the substrate wafer;
   providing a cap substrate, spin coating photo sensitive BCB on said cap substrate, then form a plurality of cavity walls by lithography, the position of each cavity wall is corresponding to that of the MEMS die;
   aligning and bonding the substrate wafer with the cap substrate;
   thinning the substrate wafer by backside grinding, notching to remove most of the substrate wafer material at scribe lines;
   plasma etching at the backside of the substrate wafer to remove the rest of the substrate wafer material and expose part of the compatible pads, trenches being formed;
   filling the trenches with insulating materials to cover the exposed compatible pads, spin coating this insulating material on the backside of the substrate wafer as a first insulating layer;
   notching again to expose flanks of the compatible pads;
   depositing a metal layer on the backside of the substrate wafer by sputtering, forming redistribution leads by lithography and plating;
   spin coating a photo sensitive second insulating layer to cover the redistribution leads, making openings by lithography for solder bump forming;
   forming solder bumps at the openings of the second insulating layer by screen printing, each solder bump corresponding to a compatible pad; and
   dicing the substrate wafer along the scribe lines to singulate the MEMS dies therefrom.

2. The method for fabricating a wafer level chip size package for MEMS devices as claimed in claim 1, further comprising following steps prior to the step of aligning and bonding the substrate wafer with the cap substrate:
   forming cavities on the cap substrate by wet etching or plasma etching, utilizing the cavity walls as a mask so that the position of each cavity corresponds to that of the MEMS die.

3. The method for fabricating a wafer level chip size package for MEMS devices as claimed in claim 1, further comprising one or both of following steps:
   before cavity formation, making one pair of alignment marks at backside of the cap substrate by lithography, so that the alignment of cavity formation and bonding will be according to these marks; and
   before the first notch, spin coating photo resist on backside of the substrate wafer and making photo resist openings at the positions corresponding to those of the compatible pads by backside align system or IR align system; the first notch will be aligned according to these openings and the photo resist will be utilized as a mask for etching which is the following step of the first notch.

4. The method for fabricating a wafer level chip size package for MEMS devices as claimed in claim 3, wherein the type of photo resist for the first notch is positive.

5. The method for fabricating a wafer level chip size package for MEMS devices as claimed in claim 1, wherein the gases for etching are fluorocarbon or sulfur-fluoride.

6. A method for fabricating a wafer level chip size package for MEMS devices, comprising:
- providing a substrate wafer having formed thereon MEMS dies, with a plurality of compatible pads disposed at the periphery of each of said MEMS dies on said wafer;
- providing a cap substrate;
- screen printing glass frit on the cap substrate to form cavity walls;
- aligning and bonding the substrate wafer with the cap substrate;
- thinning the substrate wafer by backside grinding, notching to remove most of the substrate wafer material at scribe lines;
- plasma etching at the backside of the substrate wafer to remove the rest of the substrate wafer material and expose part of the compatible pads, trenches being formed;
- filling the trenches with insulating materials to cover the exposed compatible pads, spin coating this insulating material on the backside of the substrate wafer as a first insulating layer;
- notching again to expose flanks of the compatible pads;
- depositing a metal layer on the backside of the substrate wafer by sputtering, forming redistribution leads by lithography and UBM technique;
- spin coating a photo sensitive second insulating layer to cover the redistribution leads, making openings by lithography for solder bump forming;
- forming solder bumps at the openings of the second insulating layer by screen printing, each solder bump corresponding to a compatible pad; and
- dicing the substrate wafer along the scribe lines to singulate the MEMS dies therefrom.

7. The method for fabricating a wafer level chip size package for MEMS devices as claimed in claim 6, further comprising following steps prior to the step of screen printing glass frit on the cap substrate to form cavity walls:
- depositing a passivation layer on frontside of the cap substrate by PECVD, spin coating photo resist on the passivation layer, making pattern by lithography, the area which need not to be etched should be covered by photo resist;
- plasma etching at frontside of the cap substrate, after etching, stripping the photo resist, the pattern of the passivation layer being the same as that of the photo resist; and
- making cavities on the cap substrate by wet etching or dry etching, utilizing the passivation layer as a mask so that the position of each cavity corresponds to that of the MEMS die.

8. The method for fabricating a wafer level chip size package for MEMS devices as claimed in claim 6, further comprising one or more of following steps:
- before cavity formation, making one pair of alignment marks at the backside of the cap substrate by lithography, so that the alignment of cavity formation and bonding will be according to these marks;
- with reference to the marks at the backside, making another pair of alignment marks at frontside of the cap substrate by lithography, so that the screen print will be aligned according to these marks;
- before the first notch, spin coating photo resist on the backside of the substrate wafer and making photo resist openings at the positions corresponding to those of the compatible pads by backside align system or IR align system; and
- the first notch will be aligned according to these openings and the photo resist will be utilized as a mask for etching which is the following step of the first notch.

9. The method for fabricating a wafer level chip size package for MEMS devices as claimed in claim 8, wherein the type of photo resist for the first notch is positive.

10. The method for fabricating a wafer level chip size package for MEMS devices as claimed in claim 6, wherein the gases for etching are fluorocarbon or sulfur-fluoride.

* * * * *